(12) United States Patent
Bollinger

(10) Patent No.: US 7,019,771 B1
(45) Date of Patent: Mar. 28, 2006

(54) INSPECTION DEVICE FOR COMPONENTS

(75) Inventor: Peter Bollinger, Beoppard-Udenhausen (DE)

(73) Assignee: PULSOTRONIC Merten GmbH & Co. KG, Wiehl (DE)

( * ) Notice: Subject to any disclaimer, the term of this patent is extended or adjusted under 35 U.S.C. 154(b) by 694 days.

(21) Appl. No.: 10/031,704

(22) PCT Filed: Jun. 30, 2000

(86) PCT No.: PCT/EP00/06117

§ 371 (c)(1),
(2), (4) Date: Jun. 4, 2002

(87) PCT Pub. No.: WO01/08461

PCT Pub. Date: Feb. 1, 2001

(30) Foreign Application Priority Data

Jul. 23, 1999 (DE) ................................. 199 34 619

(51) Int. Cl.
*H04N 7/18* (2006.01)
*H04N 9/47* (2006.01)

(52) U.S. Cl. ...................................... 348/125; 382/145

(58) Field of Classification Search ........ 348/125–137, 348/140; 250/201.3, 202, 204; 359/196, 359/204, 205, 211, 212, 227; 356/237.1, 356/239.2, 239.3; 382/181, 190, 199, 206
See application file for complete search history.

(56) References Cited

U.S. PATENT DOCUMENTS

| | | | | |
|---|---|---|---|---|
| 4,914,513 A | * | 4/1990 | Spigarelli et al. | .............. 348/87 |
| 5,801,832 A | * | 9/1998 | Van Den Brink | ............ 356/500 |
| 6,366,310 B1 | * | 4/2002 | Nagai et al. | ................... 348/87 |
| 6,410,872 B1 | * | 6/2002 | Campbell et al. | ............ 209/577 |
| 6,762,831 B1 | * | 7/2004 | Shibata et al. | ............ 356/237.2 |
| 6,813,016 B1 | * | 11/2004 | Quist | ....................... 356/237.1 |
| 6,862,365 B1 | * | 3/2005 | Beaty et al. | ................. 382/145 |
| 6,879,390 B1 | * | 4/2005 | Kvamme et al. | ......... 356/237.2 |

FOREIGN PATENT DOCUMENTS

| | | | |
|---|---|---|---|
| EP | 0878992 A2 | * | 11/1998 |
| WO | WO 96/12395 | * | 4/1996 |
| WO | WO 99/00661 | * | 1/1999 |

* cited by examiner

*Primary Examiner*—Nhon Diep
(74) *Attorney, Agent, or Firm*—Diller, Ramik & Wight

(57) ABSTRACT

The components (11) to be examined are held by suction at a support device (10) and inspected by a video camera. The workpiece is recorded from two different sides via different beam paths (25, 26) using the same video camera, wherein two pictures of the same object are reproduced in different views and evaluated by image processing. Thus, it can be determined whether the component (11) is intact and, in particular, whether its legs (13) are present and at the correct place.

15 Claims, 4 Drawing Sheets

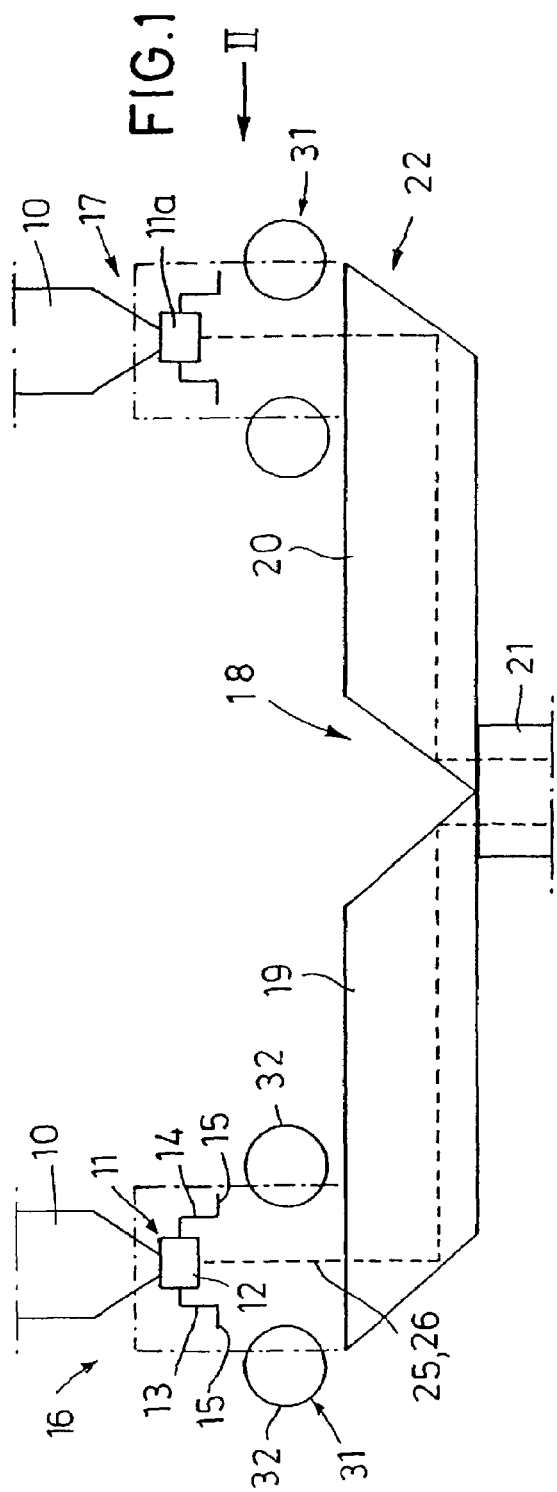
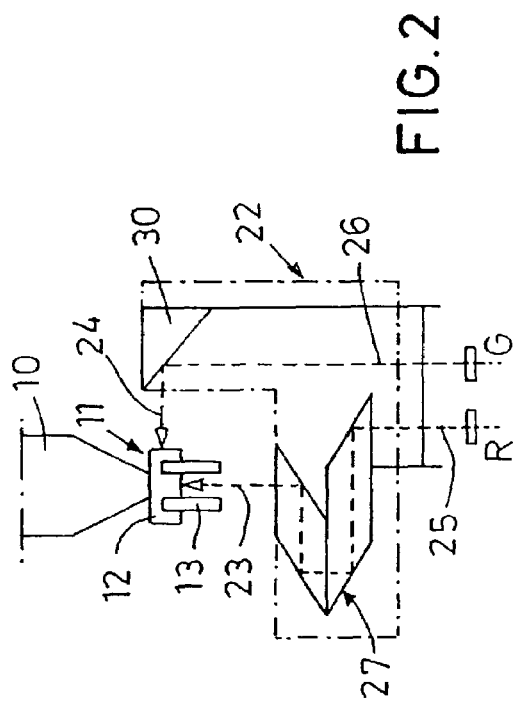

INSPECTION DEVICE FOR COMPONENTS

The present invention refers to an inspection device for components' comprising a video camera recording pictures of the component.

In series production, components are inserted into circuit boards using component mounting automats that move the respective component to its position for soldering or bonding. The components, which are often miniaturized components of a size ranging from 1 to 10 mm, have to be inspected prior to being inserted so as to ensure that the component is intact in order to be processed. In particular, it has to be ensured that all legs of the component are present and take the correct position. Typically, such inspection is effected with a video camera and a connected computer adapted for image processing and comparing the recorded video image with a pre-stored standard image of the component. Thus, it can be determined without any human interference, whether an object to be mounted or processed otherwise is intact.

For a complete inspection, it is necessary to record the component from various directions. In a picture taken from only one direction, defects of the component may be covered.

With miniaturized components, it is difficult for reasons of space to take a plurality of pictures at the same time using the necessary several video cameras.

It is the object of the present invention to provide an inspection device for components that allows for a simultaneous recording of pictures of a component, taken from different directions, the device further being suited for miniature components.

According to the invention, the object is solved with the features defined in claim 1.

In the present inspection device, a single video camera takes a plurality of pictures of the component from different directions, an optical deflecting device being disposed in the beam path of at least one of the pictures. Thus, both pictures taken simultaneously from different directions can be supplied to the video camera from the same receiving direction so that both pictures can be reproduced in different areas of the video image. According to the invention, a single video camera is used to reproduce a plurality of pictures. Thus, also the evaluation of the pictures is effected by automatic image processing using a single video image. The inspection device can be used in very restricted space and has particular applicability in evaluating and assessing miniature components, since it is not necessary to direct several video cameras on a single component.

As the video camera, particular use lies with a CCD camera with a sensor field of charge storage elements that are influenced by light signals. The different images may fall in parallel on the objective of the camera, but they are laterally offset from each other so that they will not overlap.

In a preferred development of the present invention, a length compensation device is arranged in the beam path of one of the pictures between the component and the video camera, equalizing the length of this beam path to that of the other beam path. Thus, both pictures are focused in common by the video camera. The length compensation device may comprise mirrors or, preferably, a prism arrangement causing a meander-like beam path.

The invention provides the possibility to image and evaluate a plurality of components simultaneously using the video camera. To this end, a beam combining device is provided that supplies the pictures of two spaced apart components to the video camera at the same time. Such a beam combining device comprises a mirror device or a prism arrangement. Its application requires that the components are simultaneously present at two defined spaced positions.

A defined and reproducible inspection requires defined illumination conditions. In illuminating the object, glaring and similar influences must be avoided. In a development of the invention, two illumination devices are provided, one of which is meant for the first picture, while the other is meant for the second picture of the component. Both illumination devices emit light with different light characteristics, such that the light of one picture is not disturbed by the light of the other picture. The different light characteristics may be, for example, different wavelengths or different polarization directions. What matters is that a selective illumination is effected for each picture that cannot be sensed by the other picture. The recorded pictures may be separated by corresponding filters.

In a preferred embodiment of the invention, an illumination device illuminates the component vertically on the same side from which the picture is taken, while the other illumination device illuminates the component with opposite light. The recording directions of both pictures are preferably at right angles relative to each other.

When the illumination devices emit light having different wavelengths, the video camera used may be a monochrome or a polychrome camera. With a monochrome camera it must be ensured that it is sensitive to both wavelengths selected.

The following is a detailed description of an embodiment of the present invention with reference to the accompanying drawings.

In the Figures:

FIG. 1 is a schematic side elevational view of an inspection device,

FIG. 2 is a view in the direction of the arrow II in FIG. 4,

Figure 3:
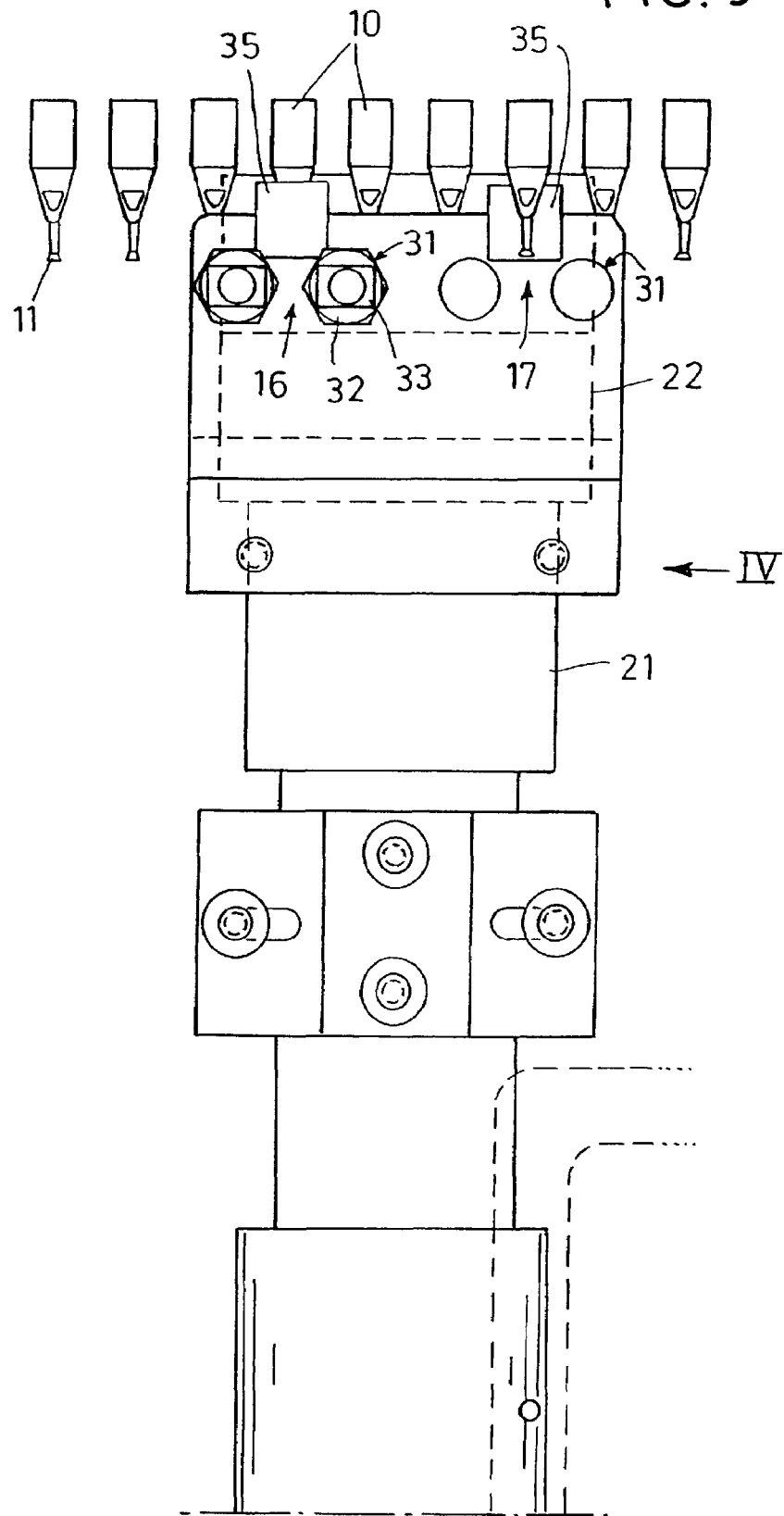
Figure 4:
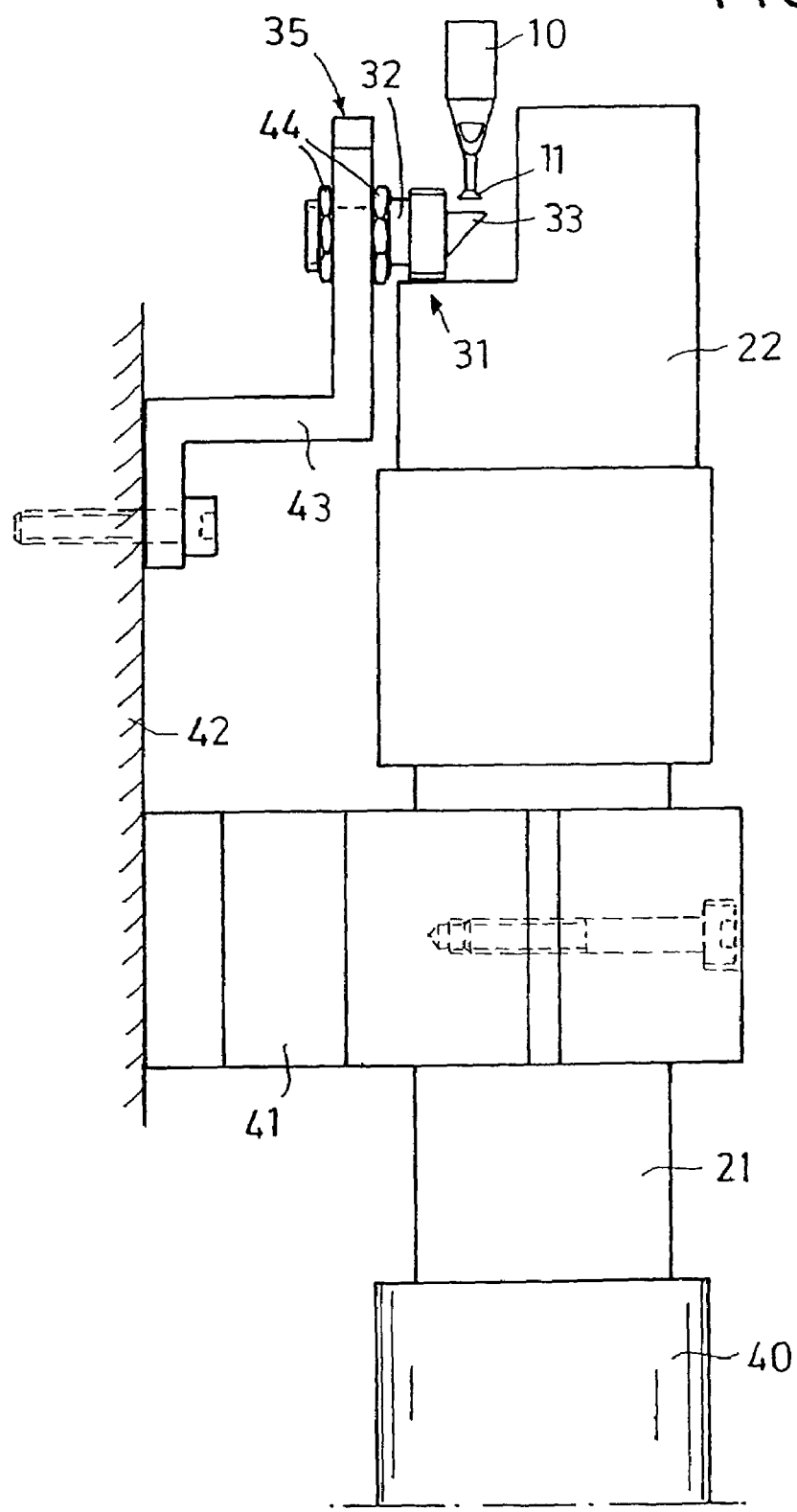
Figure 5:
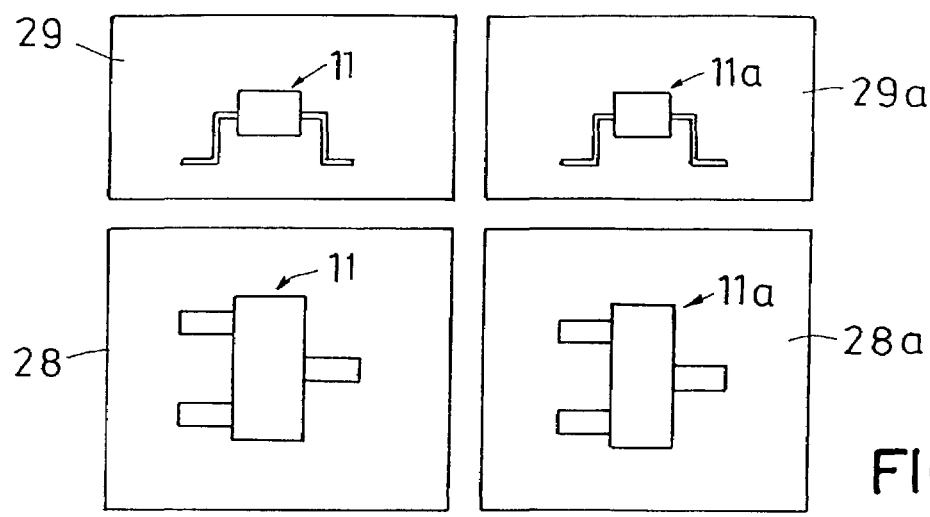
Figure 6:
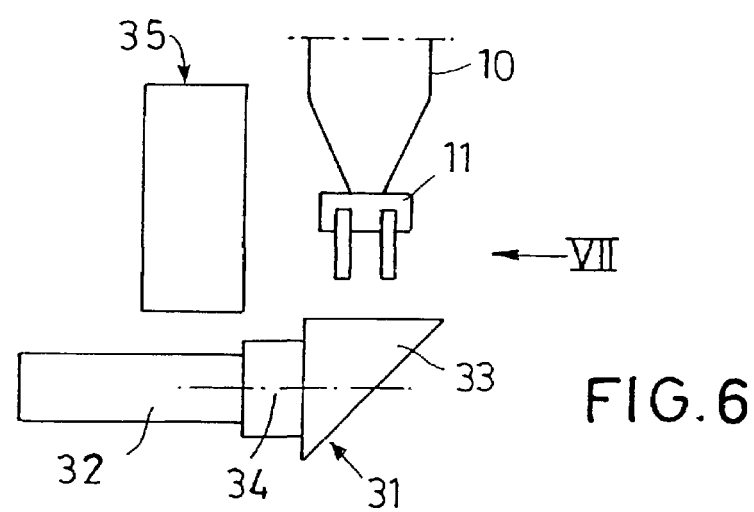
Figure 7:
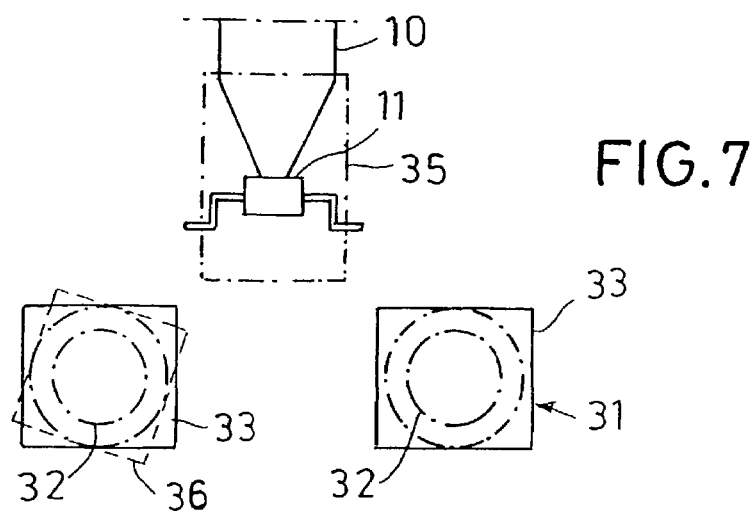

FIG. 3 is a schematic view of the assembled inspection device, seen from the same direction as in FIG. 1, FIG. 4 is a view on FIG. 3 seen in the direction of the arrow IV, FIG. 5 is an illustration of the video picture generated in the video camera, FIG. 6 is a mechanical representation of the illumination devices directed towards the component, and FIG. 7 is view in the direction of the arrow VII of FIG. 6.

The inspection device comprises several supporting devices 10, which in the present case are aspirating pipettes aspirating air through a thin intake opening, thereby drawing the component 11 towards the air intake opening and holding it there. The supporting devices 10 are arranged in a row along a continuous conveyor indexed according to the respective machine cycle.

In this instance, the components 11 are, for example, transistors with a body 12 and legs 13, 14 projecting therefrom in opposite directions. Two legs 13 project to one side and one leg 14 projects to the other side. The legs are angled twice and each have a rest portion 15 set flat on a circuit board and soldered to a conductor path. Among other things, the inspection device checks whether all legs 13 and 14 are present and whether they are correctly positioned.

As illustrated in FIG. 1, recording positions 16, 17 are provided at two positions along the conveying path of the supporting devices 10, the components 11, 11a being imaged at these positions by a video camera. A beam combining device 18 of a first prism 19 and a second prism 20 extends between these two recording positions. Each of the prisms 19, 20 directs a picture of a respective component 11 and 11a to the objective 21 of the camera, the beam paths of both pictures being represented by dotted lines. It can be seen that both pictures are input in parallel into the objective 21, yet with a lateral offset, so that both pictures are imaged on different locations on the sensor of the video camera. The beam paths from both components 11, 11a to the objective 21 are illustrated in dotted lines in FIG. 1. These beam paths first extend in parallel at a great distance, then they converge at right angles and eventually enter the objective 21 in parallel and close to each other.

The beam combining device 18 and the recording positions 16, 17 are located within an attachment 22 to the objective mounted to the front of the objective 21 of the video camera. The supporting devices 10 move along this attachment 22.

FIG. 2 illustrates a component 11 sucked and held by a supporting device 10, seen in the direction of the arrow II in FIG. 1. The component is recorded by a video camera from a first direction 23 (from below) and a second direction 24 (from the side). Both directions 23, 24 extend at right angles to each other. The direction 23 is part of a beam path 25 and the direction 24 is part of a beam path 26. The directions 23, 24 indicate the viewing direction of the video camera. The light beams, however, run in the opposite direction from the component to the video camera.

In the beam path 25, a length compensation device 27 of two prisms is provided that prolongs the beam path 25 and makes it of a length equal to the other beam path 26. The fact that both beam paths 25, 26 have substantially the same length ensures that both pictures can be focused at the video camera. The length compensation device 27 is designed such that the incoming beam and the emitted beam are in parallel.

FIG. 5 illustrates the video image generated by the two components 11, 11a. The component 11 is represented in two pictures 28, 29, the picture 28 being a top plan view and the picture 29 being a side elevational view. The component 11a is also represented in two pictures 28a, 29a. All four pictures are commonly generated on the sensor screen of the video camera and may be displayed in common on a monitor.

The beam path 26 that first runs parallel to the beam path 25 is deflected by a right angle by means of a optical deflecting device 30 so as to meet the component 11 from the side following the direction 24.

The illumination of the component is effected for each of the two pictures 28, 29 using light with different characteristics. A first illumination device 31 (FIGS. 6 and 7) illuminates the component 11 from below. This illumination device 31 comprises two light sources 32 that are arranged horizontally, their light being directed vertically upward by a respective prism 33. Together with the associated prism 33, the light sources 32 may be rotated about the main emission axis 34 and adjusted to set different tilting angles, as illustrated in FIG. 7 at 34. The light sources are arranged at a mutual distance so that each light source is located obliquely below the component 11. The beam path of the video camera passes between the two light sources 32. The bottom surface of the component 11 is recorded in direct light by illuminating the same directly using the illumination device 31.

The second illumination device 35 is arranged laterally beside the component 11 on the side opposite the recording side. This means that the recording direction 24 points to the illumination device 35. From this direction 24, the component 11 is recorded in counter-light, i.e., the picture shows a corresponding silhouette of the component.

The illumination devices 31, 35 operate with light of different wavelengths. The light sources of the illumination device 31 may, for example, emit red light, while those of the illumination device 35 emit green light. Accordingly, as illustrated in FIG. 2, a red filter R is provided in the beam path 25, which allows only red light to pass, whereas a green filter G is disposed in the beam path 26, allowing only green light to pass. Thus, the picture 28 is taken in red light and the picture 29 is taken in green light. Both types of light do not interfere with each other and, in particular, no disturbing glare occurs.

FIGS. 3 and 4 illustrate the structure of the inspection device. Immediately in front of the objective 21 of the video camera 40, the attachment 22 is mounted which includes the elements illustrated in FIGS. 1 and 2. The objective 21 of the camera 40 is fastened to the machine frame through a holder 41. An angular support 43 carries the Illumination device 31. Screws 44 fasten the light source 32 to this angular support. The prism 33 that directs the light from the light source 32 upward, is located below the course of the support devices 10. The components 11 are moved along this course with their legs 13, 14 directed forward and backward. The illumination device 35 is provided as a light emitting diode array on the angular support 43.

What is claimed is:

1. An inspection device for inspecting components (11) comprising a video camera (40) for recording a first picture (28) of a component (11) from a first direction (23), an optical deflection device (30) which supplies a second picture (29) of the component (11) to the video camera (40), the second picture being taken from a direction (24) different from the first direction (23) and both pictures (28, 29) being reproduced at different locations of the video image produced by the video camera, the directions from which the two pictures taken are being directed to different sides of the recording area, a length compensation device (27) being provided in a first beam path (25) of one of the pictures (28, 29) between the component (11) and the video camera (40) for making the length of this the first beam path equal to the length of a second beam path (26) and at least one illumination device (31) including a light source (32) mounted for rotation about a main beam axis (34) and being connected to a deflection device (33) rotating together therewith.

2. The inspection device as defined in claim 1 wherein the beam paths (25, 26) of both pictures (28, 29) are incident in parallel relationship into the video camera (40).

3. The inspection device as defined in claim 1 wherein a beam combining device (18) is provided that directs the pictures of two spaced components (11, 11a) simultaneously to the video camera (40).

4. The inspection device as defined in claim 2 wherein a beam combining device (18) is provided that directs the pictures of two spaced components (11, 11a) simultaneously to the video camera (40).

5. The inspection device as defined in claim 1 wherein a first illumination device (31) is provided for illuminating the component (11) to generate the first picture (28), a second illumination device (35) is provided for illuminating the component (11) for generating the second picture (29), and the illumination devices (31, 35) emit light of different light characteristics such that the light of one picture is not affected by the illumination of the other picture.

6. The inspection device as defined in claim 5 wherein the different light characteristics are different wavelengths.

7. The inspection device as defined in claim 1 wherein one illumination device (31) illuminates the component (11) directly at the same side where the picture (28) is taken, and the other illumination device (35) illuminates the component (11) with counter light.

8. The inspection device as defined in claim 1 wherein the illumination device (31) comprises two light sources (32), and the beam path (25) of one of the pictures (28) passes between the light sources.

9. An inspection device for inspecting components (11) comprising a video camera (40) for recording a first picture (28) of a component (11) from a first direction (23), an optical deflection device (30) which supplies a second picture (29) of the component (11) to the video camera (40), the second picture being taken from a direction (24) different from the first direction (23) and both pictures (28, 29) being reproduced at different locations of the video image produced by the video camera, the directions from which the two pictures are taken being directed to different sides of the recording area, a length compensation device (27) being provided in a first beam path (25) of one of the pictures (28, 29) between the component (11) and the video camera (40) for making the length of the first beam path equal to the length of a second beam path (26), means for conveying the components (11) along a path of travel including at least first and second relatively spaced positions, and taking the first and second pictures of the components simultaneously at the first and second relatively spaced positions by the same video camera (40).

10. The inspection device as defined in claim 9 wherein the beam paths (25, 26) of both pictures (28, 29) are incident in parallel relationship into the video camera (40).

11. The inspection device as defined in claim 9 wherein a beam combining device (18) is provided that directs the pictures of two spaced components (11, 11a) simultaneously to the video camera (40).

12. The inspection device as defined in claim 10 wherein a beam combining device (18) is provided that directs the pictures of two spaced components (11, 11a) simultaneously to the video camera (40).

13. The inspection device as defined in claim 9 wherein a first illumination device (31) is provided for illuminating the component (11) to generate the first picture (28), a second illumination device (35) is provided for illuminating the component (11) for generating the second picture (29), and the illumination devices (31, 35) emit light of different light characteristics such that the light of one picture is not affected by the illumination of the other picture.

14. The inspection device as defined in claim 9 wherein one illumination device (31) illuminates the component (11) directly at the same side where the picture (28) is taken, and the other illumination device (35) illuminates the component (11) with counter light.

15. An inspection device for components (11) comprising a video camera (40) for recording a first picture (28) of a component (11) from a first direction (23), an optical deflection device (30) which supplies a second picture (29) of the component (11) to the video camera (40), the second picture being taken from a direction (24) different from the first direction (23) and both pictures (28, 29) being reproduced at different locations of the video image produced by the video camera, the directions from which the two pictures are taken are directed to different sides of the recording area, a length compensation device (27) being provided in a first beam path (25) of one of the pictures (28, 29) between the component (11) and the video camera (40) for making the length of the first beam path equal to the length of a second beam path (26), a first illumination device (31) being provided for illuminating the component (11) to generate the first picture (28), a second illumination device (35) being provided for illuminating the component (11) for generating the second picture (29), the illumination devices (31, 35) emit light of different light characteristics such that the light of one picture is not affected by the illumination of the other picture, said one illumination device (31) illuminates the component (11) directly at the same side where the picture (28) is taken, and the other illumination device (35) illuminates the component (11) with counter light.

* * * * *